United States Patent [19]

Chieli

[11] Patent Number: 4,701,631
[45] Date of Patent: Oct. 20, 1987

[54] MONOLITHICALLY INTEGRATED CONTROL CIRCUIT FOR THE SWITCHING OF TRANSISTORS

[75] Inventor: Davide Chieli, Milan, Italy

[73] Assignee: SGS Microelettronica SpA, Agrate Brianza, Italy

[21] Appl. No.: 795,664

[22] Filed: Nov. 6, 1985

[30] Foreign Application Priority Data

Nov. 7, 1984 [IT] Italy ................................ 23464 A/84

[51] Int. Cl.⁴ ...................... H03K 17/60; H03K 3/33; G05F 1/40
[52] U.S. Cl. .................................... 307/254; 307/280; 307/300; 323/289
[58] Field of Search ........... 307/300, 280, 270, 299 A, 307/254; 323/289

[56] References Cited

U.S. PATENT DOCUMENTS

| | | | |
|---|---|---|---|
| 4,055,794 | 10/1977 | Ickes et al. | 307/300 |
| 4,318,011 | 3/1982 | Zeis | 307/300 |
| 4,410,810 | 10/1983 | Christen | 307/300 |
| 4,533,839 | 8/1985 | Balakrishnan | 307/300 |
| 4,549,095 | 10/1985 | Stefani et al. | 307/300 |
| 4,566,060 | 1/1986 | Hoeksma | 323/289 |

*Primary Examiner*—Stanley D. Miller
*Assistant Examiner*—B. P. Davis
*Attorney, Agent, or Firm*—Wenderoth, Lind & Ponack

[57] ABSTRACT

A monolithically integrated control circuit for the switching of transistors includes a control circuit coupled to a switching signal source. Signals from the signal source cause control circuit to switch at least one transistor connected thereto. The control circuit includes a current generated circuit designed to supply the at least one transistor with a high current. A current limiting circuit, actuated with a predetermined delay with respect to a turn-on cntrol signal used to switch the at least one transistor, limits the current supplied from the current generator circuit to the minimum level required to keep the at least one transistor at a conduction level which has been reached.

12 Claims, 2 Drawing Figures

Moreover, although the transistor $T_F$ is shown as a bipolar NPN transistor in FIG. 1, it may also be a bipolar PNP transistor or even a field effect transistor, for example, a MOSFET.

The circuit control means C includes a current generator circuit means, shown by a block A within the block C and is designed to supply the base of the transistor $T_F$ with the maximum current designed to make the turn-on transient as rapid as possible.

The current generator circuit means is coupled to a current limiting circuit means LIM which, when actuated, is designed to limit the flow of current supplied to the base of the transistor $T_F$ to a level corresponding to the minimum current required to keep it conductive, in particular in the saturation condition.

It should be noted that, in most cases, the transistor $T_F$ may be monolithically integrated with the control circuit of the invention and may be included, together with this circuit, in an integrated circuit which is more complex. Multiple transistors may also be used to form transistor $T_F$.

The current limiting circuit means LIM is coupled via a circuit delay component R to the switching signal source SW and is activated by the switching signals which also cause the turn-on of the transistor $T_F$.

Actuation therefore takes place, as a result of the circuit delay component R, with a predetermined delay with respect to the turn-on control of the transistor $T_F$.

By suitably regulating both the level of the current generated by the circuit means A and the delay in the actuation of the current limiting circuit means LIM, and the extent of the current limitation caused by the limiting circuit means LIM, it is possible to optimize the supply of current to the base of the transistor $T_F$, thereby making switching to conduction (in particular to maximum saturation) as rapid as possible, while limiting the current absorption to a level necessary to keep the transistor at the conduction level which has been reached.

The operation of a control circuit of the invention is now explained with reference to the operation of the preferred circuit embodiment of the invention shown in FIG. 2.

The circuit of FIG. 2 comprises a first bipolar NPN transistor $T_1$ whose base terminal is connected, via a first resistance $R_1$, to the output terminal $V_1$ of a switching signal generator shown by a block SW in the drawing.

The collector terminal of the transistor $T_1$ is connected to the positive terminal $V_{cc}$ of a supply voltage generator via a first constant current generator $A_1$ and to the base of a second bipolar NPN transistor $T_2$.

The emitter terminal of the transistor $T_1$ is connected to the negative terminal $-V_{cc}$ of the supply voltage generator to which the emitter terminal of the transistor $T_2$ is also connected via a second resistance $R_2$.

The collector terminal of the transistor $T_2$ is connected via a first current mirror circuit, comprising a third bipolar PNP transistor $T_3$ and a first diode $D_3$, to the base terminal of a fourth bipolar transistor $T_F$ which is designed to be driven so as to switch.

The anode of the diode $D_3$ and the emitter terminal of the transistor $T_3$ are connected to the positive supply voltage terminal $+V_{cc}$. The cathode of the diode $D_3$ is connected to the base terminal of the transistor $T_3$ and to the collector terminal of the transistor $T_2$. The collector terminal of the transistor $T_3$ is connected to the base terminal of the transistor $T_F$ which is driven so as to switch and which is shown in the drawing as an NPN transistor.

The collector and emitter of the transistor $T_F$ is inserted between the two terminals of the supply voltage generator, in series with an inductive load shown by an inductance L and a resistance $R_L$ connected in series. A recycling diode $D_E$ is connected in parallel with the load.

A constant current generator $A_1$, the transistor $T_2$ and the current mirror $D_3, T_3$ form the current generator circuit means included in the circuit control means.

The circuit of FIG. 2 further comprises a fifth bipolar NPN transistor $T_5$ type whose base terminal is also connected to the output terminal $V_1$ of the switching signal generator SW via a fourth resistance $R_4$ and a second diode $D_4$ connected in series.

The base terminal of the transistor $T_5$ is also connected to the negative terminal $-V_{cc}$ via a fifth transistor $R_5$ and a third diode $D_5$ connected in series.

The collector terminal of the transistor $T_5$ is connected via a second constant current generator $A_5$ to the positive terminal $+V_{cc}$ and is also connected to the base terminal of the sixth bipolar NPN transistor $T_6$.

The collector terminal of this transistor $T_6$ is connected, via a sixth resistance $R_6$ and a fourth diode $D_6$ connected in series, to the base terminal of the second transistor $T_2$.

The emitter terminals of the transistors $T_5$ and $T_6$ are both connected to the negative terminal $-V_{cc}$.

The operation of the circuit shown in FIG. 2 will now be examined.

The switching signals of the generator SW are constituted by transitions of the voltage available at the output terminal $V_1$, related, for example, to the potential of the negative terminal $-V_{cc}$, from a "high" level to a "low" level and vice versa.

When there is a high voltage level at the terminal $V_1$, the transistor operates at saturation and absorbs all of the current supplied by the generator $A_1$ so as to thereby keep the transistor $T_2$, and consequently the transistors $T_3$ and $T_F$, cut off.

The transistor $T_5$ also operates at saturation and absorbs all of the current supplied by the generator $A_5$ so as to keep the transistor $T_6$ cut off.

When the level of the voltage at the terminal $V_1$ drops, the transistor $T_1$ is immediately cut off, enabling all of the current supplied by the generator $A_1$ to be supplied to the transistor $T_2$ which starts by conduct.

The current level which it supplies, via the current mirror circuit $D_3$, $T_3$, to the transistor $T_F$, is the maximum level enabled by the values of the circuit components. The switching transient of the transistor $T_F$ from cut off the conduction therefore takes place as rapidly as possible.

When the voltage level at the terminal $V_1$ drops, the transistor $T_5$ is also cut off, although not immediately as in the case of the transistor $T_1$, since the diode $D_4$ prevents the discharge, via the resistance $R_4$, of the charges accumulated in the base of the transistor $T_5$ during its previous saturation.

The elimination of these charges must therefore take place by recombination in the base and by removal via the diode $D_5$ and the resistance $R_5$, which are suitably chosen such that this removal takes place in a predetermined period of time which provides a constant delay with respect to the cut off of the transistor $T_5$.

MONOLITHICALLY INTEGRATED CONTROL CIRCUIT FOR THE SWITCHING OF TRANSISTORS

BACKGROUND OF THE INVENTION

The present invention relates to monolithically integrated control circuits for the switching of transistors, and in particular to a control circuit for the rapid switching of a power transistor which may be used to drive inductive loads in high-speed printing apparatus and, in particular, in switching supply devices, also called chopper supply devices.

The control circuits of these devices have to drive an output power transistor, connected in series with an inductive load between the two terminals of a supply voltage generator, in an alternating manner from a high voltage and low current state to a low voltage and high current state, by means of base control signals.

In its first state, the power transistor is virtually an open circuit (its cut-off or "off" condition) between its emitter and collector terminals, and in its second state the transistor is a short-circuit (its conduction or "on" condition), respectively preventing or enabling the flow of current through the inductive load. The mode of operation of a transistor which comes closest to the operation of an ideal switch is that in which the transistor operates at saturation in its closed state and is cut-off in its open state.

The maximum possible switching frequency of the output power transistor is in this case limited essentially by the effects, during the passage from saturation to turn-off, of the storage of charges in its base which took place during the conduction stage.

A circuit designed to reduce the cut-off time, so as to increase the possible switching frequency and to improve the efficiency of the control circuit from the power point of view is disclosed, for example, in the Italian patent application Ser. No. 25054 A/81.

However, when it is desired to achieve the maximum possible switching frequency while maintaining maximum efficiency, it is necessary to act on the turn-on times of the controlled transistor, in particular when it has to operate at maximum saturation in the conduction state.

It is indispensable for the controlled transistor to operate in these operating conditions when, for example in the case of switching supply devices, it is desired to reduce the values of the load inductances by increasing the switching frequency.

In this case, minimizing the collector-emitter voltage of the output transistor in series with the inductive load involves being able to supply to the load a greater portion of the available supply voltage, while meanwhile decreasing the dissipation of power in the transistor itself.

In order to obtain the maximum reduction of turn-on times of a transistor, it is necessary to supply its base with the maximum possible current during the entire switching transient from the cut-off state to the conduction state.

During this transient, the transistor operates as though its current gain were much lower than its gain during normal conduction conditions.

However, this leads to the problem of limiting the level of the current supplied as soon as the transistor starts to conduct so as to prevent the reductions in efficiency which require a driving current which is higher than the current which is strictly necessary during the entire period of conduction.

The simplest efficient circuit solution to this problem is to supply the base current to the transistor via a resistor and a capacitor which have predetermined values and which are connected in parallel.

This solution, which is conventionally used by persons skilled in the art, may only be embodied, however, by means of discrete components due to the high capacitance value required.

SUMMARY OF THE INVENTION

The object of the present invention is to provide a control circuit for the rapid switching of transistors which has a very high efficiency during switching from the cut-off to the conduction state and which may be monolithically integrated.

This object maybe achieved by providing a control circuit for the switching of transistors; comprising a control circuit means having at least an input terminal coupled to a switching signal source such that signals from said signal source cause the switching of at least one output transistor whose control terminal is coupled to an output terminal of said control circuit, said control circuit means including a current generator circuit means for supplying current to said at least one output transistor via its control terminal, and a current limiting circuit means coupled to said current generator circuit means for limiting its output current and coupled to said switching signal source via a circuit delay component, wherein said current limiting circuit means is actuated by said signals from said signal source which also cause said at least one output transistor to conduct.

BRIEF DESCRIPTION OF THE DRAWINGS

The invention is described in detail below, purely by way of non-limiting example, with reference to the attached drawings, in which.

The same reference letters and numerals are used in the two drawing figures for corresponding components.

DESCRIPTION OF THE PREFERRED EMBODIMENT

Figure 1:
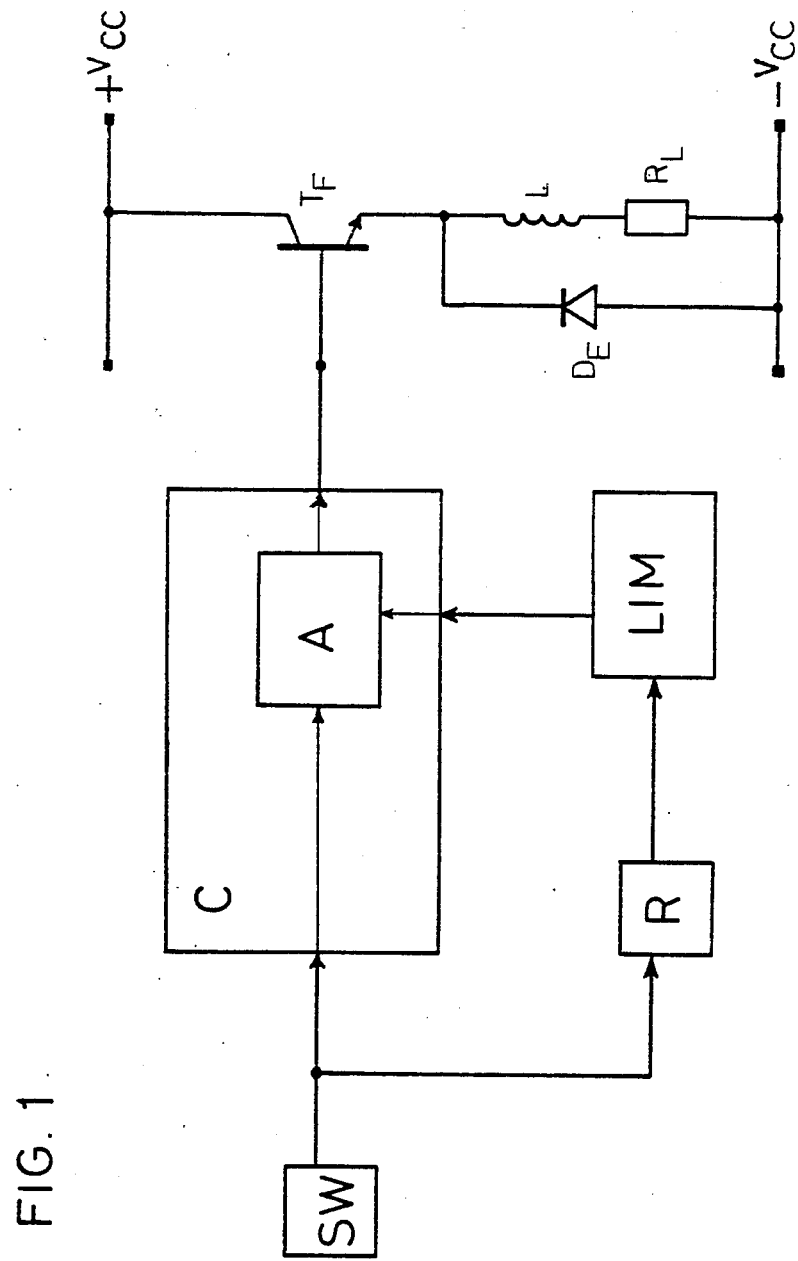
FIG. 1 is a block diagram of a control circuit of the invention.

The diagram of the switching control circuit of the present invention as shown in FIG. 1 comprises a switching signal source, shown by a block SW, coupled to the base terminal of a transistor $T_F$ which is driven by means of a circuit control means shown by a block C.

The signal source SW may also be formed solely by a circuit means for connection to a switching signal generator external to the integrated circuit.

The emitter and collector of the output transistor are connected in series with an inductive load between the positive terminal $+V_{cc}$ and the negative pole $-V_{cc}$ of a supply voltage generator. The inductive load is shown in the drawing figures by a resistance $R_L$ and an inductance L connected in series. A recycling diode $D_E$ is connected in parallel with the load.

The load may also be connected in series with the collector of the transistor $T_F$ rather than with its emitter as shown in the drawing figures. It should also be noted at this point that the diode $D_E$ is not required in cases in which the load is not inductive.

The transistor $T_5$, together with the diodes $D_4$ and $D_5$ and the resistances $R_4$ and $R_5$, is therefore a circuit delay component, shown by a block R in FIG. 1.

This delay, in accordance with the present invention, should in theory be equivalent to the switching transient of the transistor $T_F$ from the cut off state to the required conduction state.

As soon as the transistor $T_5$ is cut off, all of the current supplied by the generator $A_5$ may flow into the base of the transistor $T_6$ which immediately starts to conduct at saturation, thereby absorbing part of the current supplied by the generator $A_1$ via the diode $D_6$ and the resistance $R_6$.

The conduction of the transistor $T_6$ consequently activates a second current mirror circuit formed by the transistor $T_2$, which is already conductive, and the diode $D_6$.

The resistances $R_6$ and $R_2$ enable accurate control of the current level flowing in this second current mirror circuit, since the collector-emitter voltage of the transistor $T_6$, operating at saturation, is negligible.

The current flowing in the first current mirror circuit $T_3$, $D_3$ may therefore also be accurately controlled by this second current mirror circuit, the current being limited to a predetermined level lower than the maximum level and equal to the level which is required to keep the transistor at the required conduction level during the entire turn-on period.

This provides the maximum switching speed with the minimum absorption of current from the supply.

When the voltage level at the terminal $V_1$ becomes high again, the transistor $T_1$ begins to conduct at saturation again, thereby absorbing all of the current from the generator $A_1$ and therefore immediately deactivating both the second and the first current mirror circuits.

The transistors $T_2$ and $T_F$ are therefore switched to the cut-off state.

Figure 2:
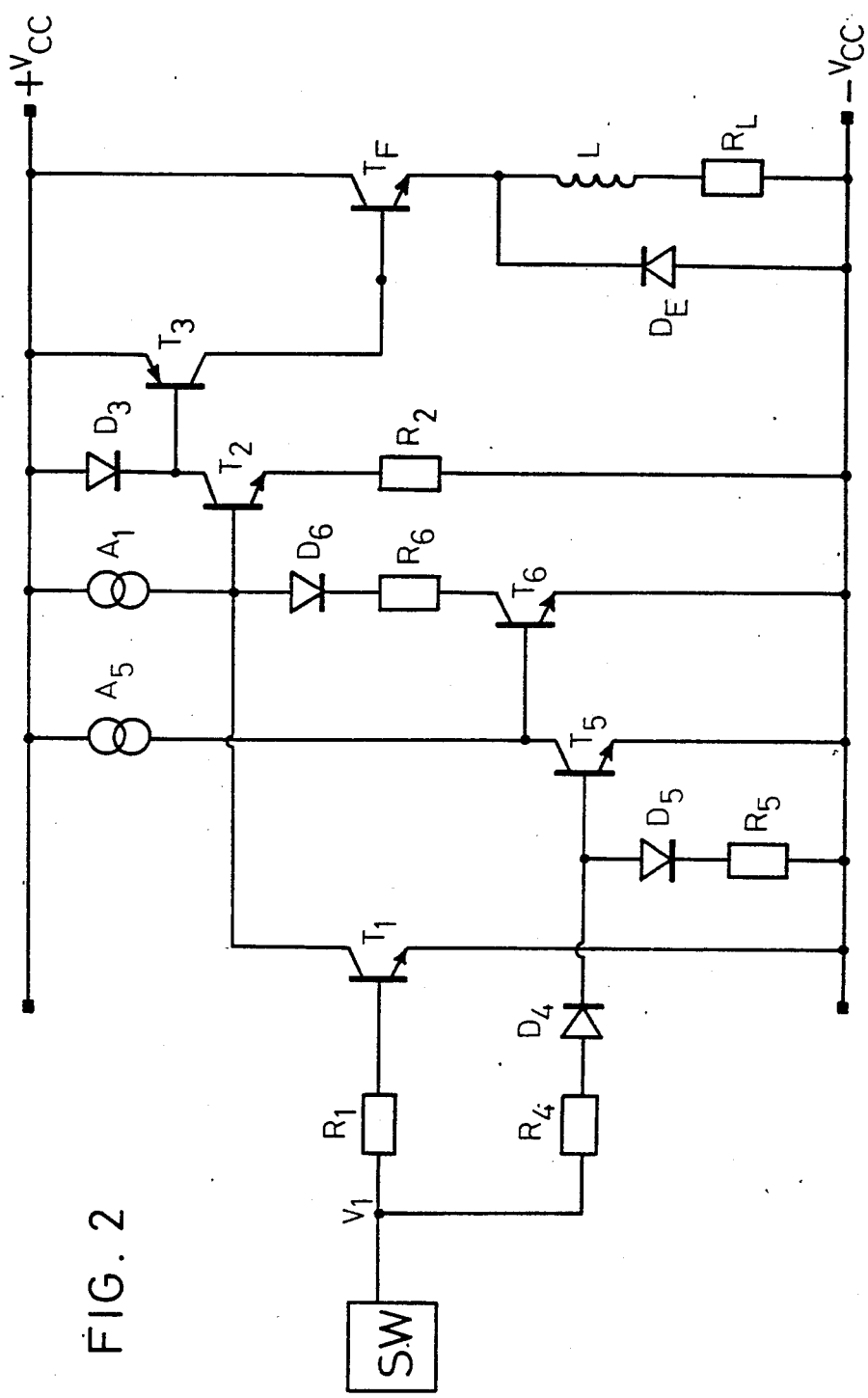
FIG. 2 is a circuit diagram of an embodiment of the control circuit of FIG. 1.

It should be noted at this point that all the circuit means disclosed in the above-mentioned Italian Patent Application may be added, with full compatibility, to the block diagram of FIG. 1 and the circuit diagram of FIG. 2 in order to make the cut off of the transistor $T_F$ as rapid as possible.

Although a single embodiment of the invention has been described and illustrated it is obvious that many variants are possible without departing from the scope of the invention.

I claim:

1. A control circuit for the switching of transistors, comprising a control circuit means having at least an input terminal which is coupled to a switching signal source such that signals from said signal source cause the switching of at least one output transistor whose control terminal is coupled to an output terminal of said control circuit, said control circuit means including a current generator circuit means for supplying current to said at least one output transistor via its control terminal, and a current limiting circuit means coupled to said current generator circut means for limiting its output current and coupled to switching signal source via a circuit delay component, wherein said current limiting circuit means is actuated by said signals from said signal source which also cause said at least one output transistor to conduct; wherein the current supplied by said current generator circuit means is greater than a minimum amount of current necessary for control of said output transistor and wherein said current limiting circuit means is disabled by the switching off of signals from said signal source 2. A control circuit as claimed in claim 1, wherein said circuit control means comprises a first and a second transistor having a conductivity of a first type and each having a first and a second terminal and a control terminal, said control terminal of the first transistor being coupled to said switching signal generator, said second terminal of said first transistor and said control terminal of said second transistor being connected to a first terminal of a supply voltage generator via a common constant current generator, said first terminal of said first transistor being connected to a second terminal of said supply voltage generator to which there is also connected, via a first resistance, said first terminal of said second transistor and wherein said second terminal of said second transistor is coupled, via a current mirror circuit means, to said control terminal of said at least one output transistor.

3. A control circuit as claimed in claim 2, wherein said circuit delay component comprises a third transistor having a conductivity of said first type and having a first and a second terminal and a control terminal, said control terminal being connected to said switching signal generator via a circuit component for monodirectional conduction, said first and second terminals being connected to said second terminal of said supply voltage generator and, via a second constant current generator, to said first terminal of said supply voltage generator respectively, and wherein said current limiting circuit means comprises a fourth transistor having a conductivity of said first type and having a first and a second terminal and a control terminal, said control terminal of said fourth transistor being connected to said second terminal of said third transistor, said first and said second terminals of said fourth transistor being respectively connected to said second terminal of said supply voltage generator and, via a first diode and a second resistance connected in series, to said control terminal of said second transistor.

4. A control circuit as claimed in claim 3, wherein said control terminal of said third transistor is also connected to said second terminal of said supply voltage generator via a circuit means for the removal of charges.

5. A control circuit as claimed in claim 3, wherein said circuit means for monodirectional conduction comprises a second diode.

6. A control circuit as claimed in claim 3, wherein said circuit means for monodirectional conduction comprises a second diode and a third resistance connected in series.

7. A control circuit as claimed in claim 4, wherein said circuit means for the removal of charges comprises a second diode and a third resistance connected in series.

8. A control circuit for the switching of transitors, comprising a control circuit means having at least an input terminal which is coupled to a switching signal source such that signals from said signal source cause the switching of at least one output transistor whose control terminal is coupled to an output terminal of said control circuit, said control circuit means including a current generator circuit means for supplying a current to said at least one output transistor via its control terminal, and a current limiting circuit means coupled to said current generator circuit means for limiting its output current and coupled to said switching signal source via a circuit delay component, wherein said current limiting circuit means is actuated by said signals from said signal source which also cause said at least one output transistor to conduct; wherein said circuit control means comprises a first and a second transistor having a conductivity of a first type and each having a first and a second terminal and a control terminal, said control terminal of the first transistor being coupled to said switching signal generator, said second terminal of said first transistor and said control terminal of said second transistor being connected to a first terminal of a supply voltage generator via a common constant current generator, said first terminal of said first transistor being connected to a second terminal of said supply voltage generator to which there is also connected, via a first resistance, said first terminal of second transistor, and wherein said second terminal of said second transistor being coupled, via a current mirror circuit means, to said control terminal of said at least one output transistor; and wherein said circuit delay component comprises a third transistor having a conductivity of said first type and having a first and a second terminal and a control terminal, said control terminal being connected to said switching signal generator via a circuit component for monodirectional conduction, said first and second terminals being connected to said second terminal of said supply voltage generator and, via a second constant current generator, to said first terminal of said supply voltage generator respectively, and wherein said current limiting circuit means comprises a fourth transistor having a conductivity of said first type and having a first and a second terminal and a control terminal, said control terminal of said fourth transistor being connected to said second terminal of said third transistor, said first and second terminals of said fourth transistor being respectively connected to said second terminal of said supply voltage generator and, via a first diode and a second resistance connected in series, to said control terminal of said second transistor.

9. A control circuit as claimed in claim 8, wherein said control terminal of said third transistor is also connected to said second terminal of said supply voltage generator via a circuit means for the removal of charges.

10. A control circuit as claimed in claim 8, wherein said component for monodirectioanl conduction comprises a second diode.

11. A control circuit as claimed in claim 8, wherein said circuit component for monodirectional conduction comprises a second diode and a third resistance connected in series.

12. A control circuit as claimed in claim 9, wherein said circuit means for the removal of charges comprises a second diode and a third resistance connected in series.

* * * * *